US005633807A

United States Patent [19]
Fishburn et al.

[11] Patent Number: 5,633,807
[45] Date of Patent: May 27, 1997

[54] SYSTEM AND METHOD FOR GENERATING MASK LAYOUTS

[75] Inventors: John P. Fishburn, Murray Hill, N.J.; Craig R. Kemp, Topton, Pa.; Catherine A. Schevon, Philadelphia, Pa.; Todd R. Seigfried, Auburn, Pa.; Sanjiv Taneja, Berkeley Heights, Pa.; Yu-Chun Wu, Allentown, Pa.

[73] Assignee: Lucent Technologies Inc., Murray Hill, N.J.

[21] Appl. No.: 431,585

[22] Filed: May 1, 1995

[51] Int. Cl.$^6$ .................................................. G06F 15/00
[52] U.S. Cl. ........................... 364/491; 364/488; 364/489
[58] Field of Search ...................... 364/488, 489, 364/490, 491, 578; 371/22.1, 22.3, 22.2, 22.6; 365/233, 203; 326/29, 38; 250/492.22, 492.2

[56] References Cited

U.S. PATENT DOCUMENTS

| | | | |
|---|---|---|---|
| 4,584,653 | 4/1986 | Chih et al. | 364/491 |
| 4,761,607 | 8/1988 | Shiragasawa et al. | 324/158 |
| 4,827,428 | 5/1989 | Dunlop et al. | 364/491 |
| 4,852,015 | 7/1989 | Doyle, Jr. | 364/491 |
| 4,965,863 | 10/1990 | Cray | 307/450 |
| 5,086,477 | 2/1992 | Yu et al. | 382/56 |
| 5,097,422 | 3/1992 | Corbin, II et al. | 364/491 |
| 5,210,701 | 5/1993 | Hana et al. | 364/491 |
| 5,212,653 | 5/1993 | Tanaka | 364/491 |
| 5,247,456 | 9/1993 | Ohe et al. | 364/491 |
| 5,369,596 | 11/1994 | Tokumaro | 364/491 |
| 5,384,710 | 1/1995 | Lam et al. | 364/489 |
| 5,388,054 | 2/1995 | Tokumaru | 364/490 |
| 5,402,358 | 3/1995 | Smith et al. | 364/490 |
| 5,416,717 | 5/1995 | Miyama et al. | 364/491 |
| 5,422,317 | 6/1995 | Hua et al. | 437/250 |
| 5,438,524 | 8/1995 | Komoda | 364/489 |
| 5,459,673 | 10/1995 | Carmean et al. | 364/488 |
| 5,493,509 | 2/1996 | Matsumoto et al. | 364/490 |

OTHER PUBLICATIONS

W.H. Crocker et al., "MACS: A Module Assembly and Compaction System", Int'l Conf. On Computer Design, 1987, pp. 205–208.

A.E. Dunlop et al., "A Procedure for Placement of Standard–Cell VLSI Circuits", IEEE Trans. On Computer–Aided Design, vol. CAD–4, No. 1, Jan. 1985, pp. 92–98.

C. Ebeling et al., "Validating VLSI Circuit Layout by Wirelist Comparison", Int'l Conf. On Computer–Aided Design, 1983, pp. 172–173.

D. Hill et al., "Algorithms and Techniques for VLSI Synthesis", Kluwer Academic Publishers, Norwell, MA, 1989, pp. 129–169.

C. Ong et al., "GENAC: An Automatic Cell Synthesis Tool", 26th ACM/IEEE Design Automation Conf., Paper 16.2, 1989, pp. 239–243.

(List continued on next page.)

*Primary Examiner*—Kevin J. Teska
*Assistant Examiner*—Jacques H. Louis-Jacques

[57] ABSTRACT

A system and method integrate mask layout tools to automate the generation of mask layouts for fabricating an integrated circuit corresponding to an input netlist and a timing specification. The mask layout is generated by the method including the steps of automatically sizing transistors specified in the netlist, clustering the sized transistors into cells, generating a cell library, and placing-and-routing the cells to generate the mask layout. The system includes associated memory and stored programs, including a plurality of mask layout tools; and a processor operated by an automatic mask layout generation program for sequentially applying the plurality of mask layout tools to generate the mask layout from the input data. The plurality of mask layout tools includes: a transistor sizing tool for sizing transistors and to generate a netlist; a cell library generation tool for generating a cell library from the netlist; a place-and-route tool for generating the mask layout; and optionally a clustering tool for clustering the netlist generated by the transistor sizing tool into a plurality of cells.

21 Claims, 5 Drawing Sheets

OTHER PUBLICATIONS

T.G. Szymanski et al., "Space Efficient Algorithms for VLSI Artwork Analysis", 20th Design Automation Conf., 983, paper 46.3, pp. 734–739.

*VSLI Technology* (S.M. Sze, Ed.), McGraw–Hill Inc., New York, 1988, pp. 157–160.

Y. You et al., "Performance–Driven Layout Through Device Sizing", IEEE 1993 Custom Integrated Circuits Conference, pp. 9.3.1–9.3.4.

FIG. 3

```
                    MAIN MENU
      MENU
    SELECTION              DESCRIPTION

1              COPY NETLIST FILES
        2              CREATE CELL LIST
        3              CLUSTERING LOGIC
        4              CREATE CELL LIBRARY
        5              CREATE PLACE-AND-PLOT DATA BASE
        6              RUN PLACE-AND-PLOT TOOL
        7              MERGE CELL LIBRARY WITH MODULE

A              AUTO GUIDANCE

Q              QUIT MAIN PROGRAM

PLEASE ENTER YOUR CHOICE (1,2,3,4,5,6,7,[A],Q): _
```

FIG. 4

```
   GENAC_TECH_FILE = PATH1
   MAINPROGRAM_WORKING_DIR = PATH2
   MACS_TECH_FILE = PATH3
   LTX_TECH_FILE = PATH4
     EXPORT   GENAC_TECH_FILE   MAINPROGRAM_WORKING_DIR
              MACS_TECH_FILE    LTX_TECH_FILE
```

SYSTEM AND METHOD FOR GENERATING MASK LAYOUTS

BACKGROUND OF THE INVENTION

1. Technical Field

The invention relates to an integrated circuit (IC) fabrication method, and in particular to a system and method for automatically generating mask layouts for integrated circuits.

2. Description of the Related Art

Advances in the fabrication of ICs, such as progress in the very large scale integration (VLSI) techniques and the resulting miniaturization of ICs, have occurred in recent years from, for example, improved fabrication processes. In the IC fabrication process, the detailed features of an IC are formed by photolithographic projection of mask layouts onto a substrate. Accordingly, detailed and accurate mask generation is important for such IC fabrication processes.

A mask features a geometrical pattern of several layers with areas that are selectively transparent or opaque to a wavelength or band of wavelengths used in a particular photolithographic system. To generate a high performance IC using a corresponding mask, a mask layout is constructed to transform individual components associated with an integrated circuit into the geometrical pattern that achieves the required integrated circuit function as well as satisfying other design criteria such as power consumption, speed, circuit size, minimizing parasitics, etc.

Mask layout generation techniques are known in the art, such as automated/computer-aided methodologies, hand-performed i.e. manual layout methodologies, and combinations of computer-aided and manual techniques.

One such automated technique uses predetermined "standard cells" in a cell library. For a particular process, this library of cells may be created beforehand by a variety of methods, including manual or automatic methods, or a mixture of manual and automatic methods. This library is created once for a particular process, and is then made available for use by many particular IC designs. Each cell in the library is a set of discrete logic functions implemented in mask form. Cells from the cell library are selected to serve as building blocks in constructing an IC. Each cell has an associated cell layout and associated information regarding performance characteristics of the cell; for example, power consumption, speed, etc. A significant advantage of using cell libraries is that each cell is already in mask format in the cell library; i.e. the cell layout is fixed, the transistor sizes are also fixed, which fixes the performance of the transistors in the resulting IC. Thus the library of cells may also contain information characterizing the delay, power consumption, and area of each cell. Like the cell layouts, this information needs to be generated only once for a particular process, and can remain unchanged as it is used by many designs.

For example, in standard cell mask layout methodologies for very large scale integration (VLSI) fabrication, a cell-level netlist, a timing specification, and performance characteristics information are used in selecting cells from the cell library. The netlist is a file or other set of specifications which defines the topological and logical structure of the circuit by listing connections between input and output ports of various cells from the standard cell library. The standard cell method may include procedures to change or revise the netlist in order to increase speed or decrease cell area or power, without changing the logic behavior of the circuit outputs.

The revised netlist and cell outlines from the database, i.e. the specification of the boundaries or physical dimensions of the cell and the input/output (I/O) terminals of a cell, are then input to a place-and-route system which arranges and connects the cells. This placement and these connections, along with the cell layouts, constitute a complete mask layout that implements the cell netlist. The performance and logic of the mask layout may be verified in subsequent steps using the performance characteristics provided for each cell. If the performance is unacceptable, either the place-and-route step is repeated or a new revised netlist is created.

Automated mask layout systems are advantageous to use for large circuits or when a complex mask layout is to be generated in a relatively short period of time. However, automated mask layout systems typically lack the capability to design high performance ICs since there are a limited number of cells from which to generate the mask layout. In addition, since the cell library is fixed, the sizes of individual transistors within a cell may not be adjusted, thus limiting design tradeoffs between power consumption, speed and area.

Manual or "by hand" mask layout permits finer adjustment of transistor sizes in order to achieve higher performance. Transistor sizes in each cell are manually adjusted in accordance with various conditions in the cell's environment, such as load capacitance, relative input arrival times, driving impedance of inputs, and delay allotment for the cell. Mask layout for each cell is created by hand, thus creating a cell library tailored specifically for that circuit and timing specification. Placement and routing of these cells can be done manually or with the aid of automatic place and route tools. Timing simulation and analysis tools may be used to determine whether the timing specification has been met.

Manual mask generation typically allows better sizing of transistors to implement increased IC speed, and to reduce power. However, the amount of time required to manually generate a mask layout is typically high, especially when circuits with large numbers of transistors are required. Especially burdensome is the time required to painstakingly verify that each cell complies with connectivity, transistor size, and mask design rules. In the case of a cell library for an automated layout system, this verification process is amortized over a large number of designs. In the case of manual mask layout, this verification must be done for each design, because each design has its own unique cell library.

Systems combining automated mask layout techniques with manual techniques have generally focused primarily on adding cells designed by hand to the cell library of an automated system or in helping to automatically create, place, and route cells in manual systems. A disadvantage of combined automatic and manual methods is that a large number of manually created special cells is required to significantly improve performance. The combined automatic and manual method therefore is still too time-consuming.

There is a need for a mask layout generation process that combines the performance advantages provided by manual layout methods; i.e. the ability to customize layout to optimize power, performance, etc., with the speed of an automated process to implement not only the requisite elements of the IC but also to generate an overall improved mask layout.

SUMMARY

In accordance with the present invention, it is recognized that an automated system for generating mask layouts including an automatic transistor sizing tool is superior in performance to automated methods, manual methods, and combinations of such heretofore automated and manual methods for generating mask layouts. Such performance superiority is obtained by employing the automatic transistor sizing tool in conjunction with other automated mask layout generating tools.

This performance superiority is not attained in current automated systems without automatic transistor sizing tools since such automatic transistor sizing tools enhance the performance characteristics of the generated mask layouts.

A system and method are disclosed for integrating mask layout tools to automate the generation of mask layouts for fabricating an IC corresponding to input data including a timing specification. The mask layout is generated by the disclosed method including the steps of automatically sizing transistors specified in a transistor netlist, clustering the sized transistors into cells, generating a cell library, and placing-and-routing the cells to generate the mask layout. The system includes associated memory and stored programs having a plurality of mask layout tools, including a transistor sizing tool for sizing transistors to generate a netlist from the input data that meets the given timing specification; and a processor operated by an automatic mask layout generation program for sequentially applying the plurality of mask layout tools to convert the input netlist and the timing specification to the mask layout. The plurality of mask layout tools may also include: a cell library generation tool for generating a cell library of cell layouts from the netlist; a place-and-route tool for using the cell library to generate the mask layout; and optionally a clustering tool for clustering the basic cells of the cell library into supercells, each supercell including a tightly connected set of basic cells.

BRIEF DESCRIPTION OF THE DRAWINGS

The features of the disclosed system and method will become more readily apparent and may be better understood by referring to the following detailed description of an illustrative embodiment of the present invention, taken in conjunction with the accompanying drawings, where:

FIG. 3 illustrates a main menu for interactive operation of the disclosed system and method;

FIG. 4 illustrates an input path file;

DESCRIPTION OF THE PREFERRED EMBODIMENTS

Figure 1:
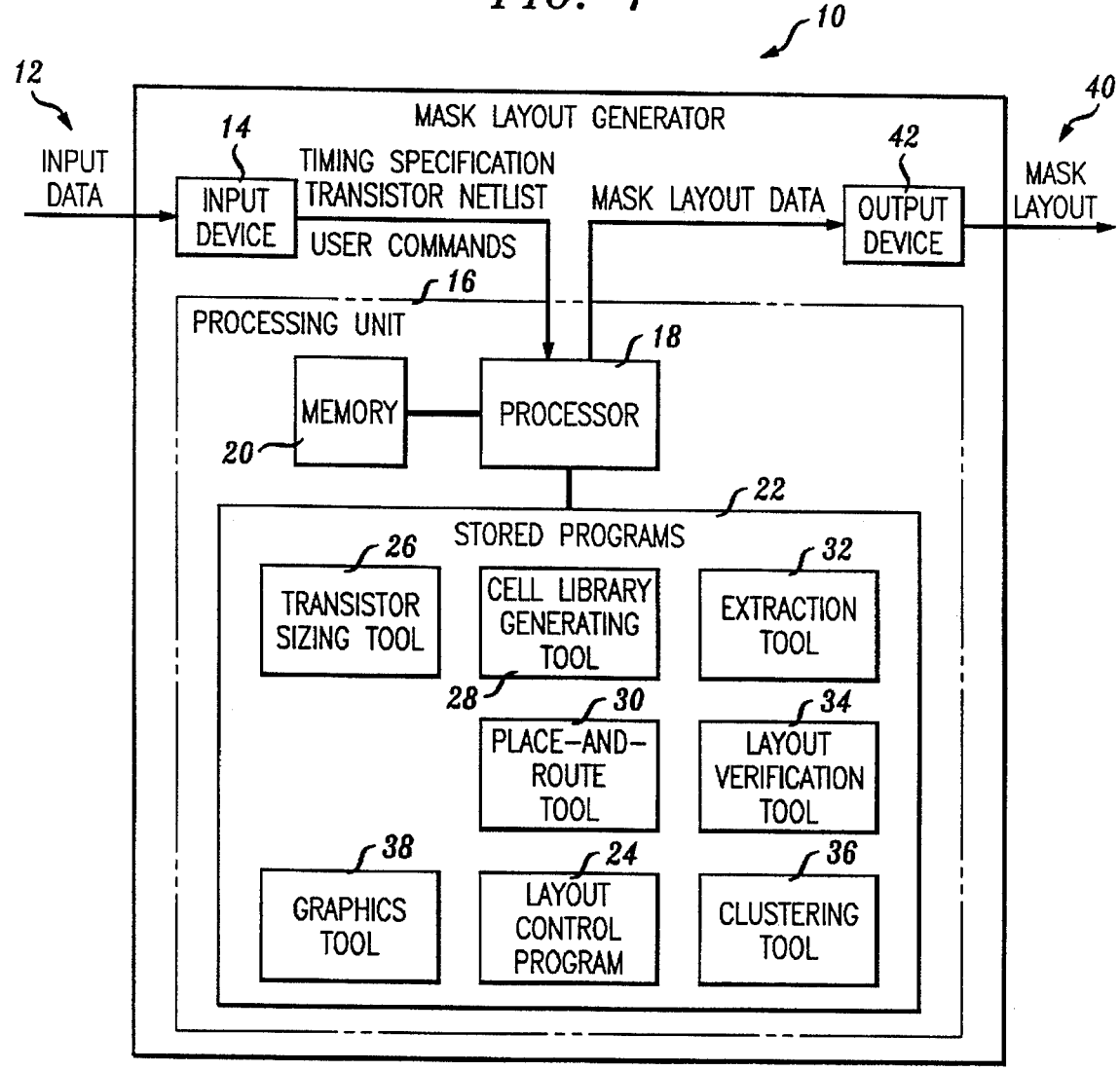
FIG. 1 illustrates the disclosed system for producing a mask layout.

Referring now in specific detail to the drawings, with like reference numerals identifying similar or identical elements, as shown in FIG. 1, the present disclosure describes a system 10 for automatically producing a mask layout using input data 12, including data and commands obtained interactively from a user, by integrating and automatically executing mask layout tools. The system 10 receives the input data 12 including a timing specification and an initial transistor netlist input from an input device 14, which may include a keyboard, a mouse, and/or a data reading device such as a disk drive for receiving the input data 12 in input data files from storage media such as a floppy disk or an 8 mm storage tape. Input device 14 may alternatively include connections to other systems to receive the input data 12.

The input device 14 sends the input data 12 to processing unit 16, which includes a mask layout processor 18 connected to associated memory 20 and stored programs 22. The system 10 may also allow the user to input operating parameters such as an estimated cell size and a predetermined cell height specification. In an exemplary embodiment, the processing unit 16 is a SPARC workstation available from Sun Microsystems, Inc. having about 10 MB associated RAM memory and a hard or fixed drive as memory 20. The mask layout processor 18 operates using the UNIX operating system to run application software as the stored programs 22 providing programs and subroutines implementing the disclosed mask layout system and method.

The stored programs 22 include a mask layout control program 24, a transistor sizing tool 26, a cell library generating tool 28, a place-and-route tool 30, a performance characteristic extracting tool 32, a mask layout verification tool 34, and optionally a clustering tool 36 and an output graphics tool 38.

Mask layout processor 18 uses the timing specification and the transistor netlist to generate mask layout data corresponding to a final mask layout 40 to be used in fabricating an IC by a photolithographic process known in the art. The mask layout data is in the form of a mask layout file which is sent to an output device 42 to generate the mask layout 40. The output device 42 may be a display for displaying the mask layout 40, and/or a printer or plotter for generating a hardcopy printout or printed graphic of the mask layout 40. The output device 42 may include specialized programs such as the output graphics tool 38 to display and/or print the generated mask layout 42. Alternatively, the output device 42 may include connections to other systems such as photolithographic systems for outputting the mask layout 40 thereto.

Figure 2:
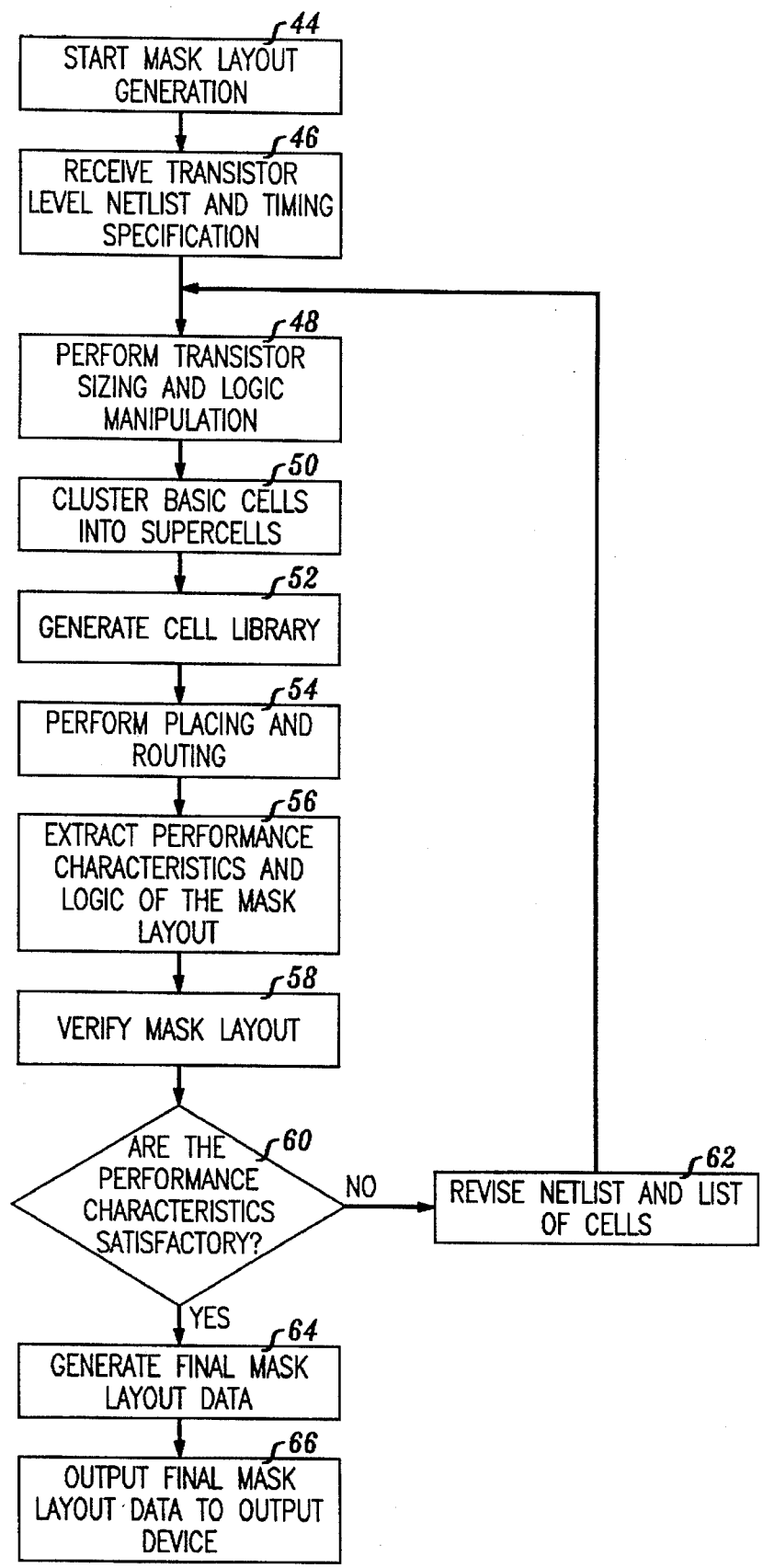
FIG. 2 is a flowchart illustrating the disclosed method for generating a mask layout.

As shown in FIG. 2, the disclosed method for generating mask layouts includes the step of starting mask layout generation in step 44 by generating and outputting, through the output device 42, a main program menu 68, shown in FIG. 3, which allows the user to individually initiate the stored programs 22. In particular, revised netlists are generated as a data file termed a module, and selection 7 in FIG. 3 merges a generated cell library with the module corresponding to the final netlist generated by the mask layout system 10 to generate the final mask layout 40.

By selecting AUTO GUIDANCE selection through the main program menu 68, the user initiates the mask layout control program 24 which automatically executes the stored programs according to the sequence of steps shown in the flowchart of the disclosed method in FIG. 2.

In an exemplary embodiment, the mask layout control program 24 responds to the selection of the AUTO GUIDANCE command to execute a path specifying file 70; for example, as shown in FIG. 4, which is provided by the user that specifies the program paths of the stored programs 22.

Once the mask layout generation is started in step 44, the method includes the steps of receiving a transistor level netlist and a timing specification in step 46; and performing transistor sizing and logic manipulation in step 48 to generate a revised netlist which meets the timing specification by selecting the size of each transistor. The logic manipulation in step 48 involves reordering of series-connected networks specified by the transistor netlist of the input data 12 in generating the revised netlist. Such logic manipulation is known in the art, such as described in D. Hill et al. "Algorithms and Techniques for VLSI Synthesis", Kluwer Academic Publishers, Norwell, Mass., 1989, pp. 129–169. The transistor netlist of the input data 12 may be represented as a set of transistors interconnected as symbolically represented as netlist 72 in FIG. 5, where the transistors are structured hierarchically to any degree from an initial root element 74 which may correspond to a representation of the IC.

Figure 5:
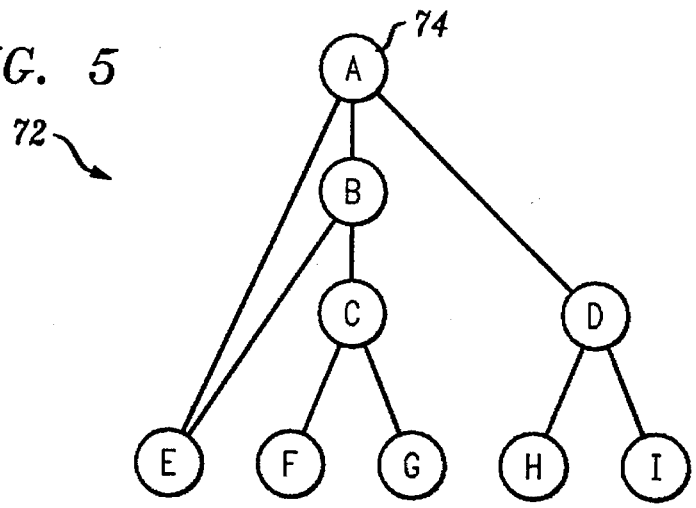
FIG. 5 illustrates a symbolic representation of a netlist.
Figure 6:
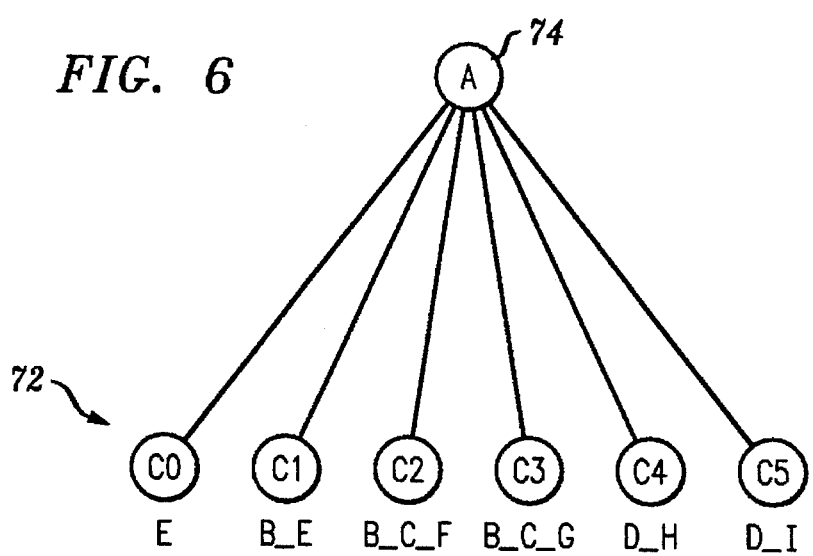
FIG. 6 illustrates a revised netlist.

In an exemplary embodiment, step 48 is performed using the transistor sizing tool 26. In an exemplary embodiment, a revised netlist is created by the transistor sizing tool 26 from the initial transistor netlist, so that a representation of the revised netlist appears "flattened" as in FIG. 6; i.e. the multi-branched hierarchy shown in FIG. 5 is converted to a hierarchy of elements 74, 76 before processing the revised netlist for sizing, where each of elements 76 is connected directly to the root element 74. As shown in FIG. 6, the original hierarchy is preserved by naming the elements 76 with parent blocks preceding the terminating elements and separated, for example, by a special separation character such as the underline character; for example, B_C_F. Because individual transistor sizing is performed, a single cell occurring multiple times in the original transistor netlist may become several different cells in the revised netlist.

The transistors in the transistor netlist are then automatically sized to achieve the performance criteria specified in the timing specification while optimizing selected parameters, such as the sum of transistor sizes, power dissipation, or layout area. Step 48 is advantageous since a by-hand method would not size every transistor due to time constraints, and since previous mask layout methods employing automated standard cell techniques have a limited selection of transistor sizes and therefore are generally unable to meet performance requirements for a desired performance level.

The use of automated transistor sizing in step 48 results in the generated mask layout meeting user-specified timing criteria while simultaneously minimizing the sum of transistor sizes. Since the sum of transistor sizes correlates positively with circuit area and circuit power consumption, the end result is minimization of circuit area and circuit power consumption. One such automated transistor sizing procedure is discussed in U.S. Pat. No. 4,827,428 to Dunlop et al., which is incorporated herein by reference.

In the exemplary embodiment, the transistor sizing tool 26 is the Timed Logic Synthesizer (TILOS) program, available from AT&T Corp., which accepts a transistor connectivity file and an I/O delay file as the transistor netlist. The delay D through a circuit path is a posynomial of the transistor sizes $x_1, \ldots, x_N$; for example, $$D = \sum_{i,j=1}^{N} a_{ij} \frac{x_i}{x_j} + \sum_{i=1}^{N} \frac{b_i}{x_i} \qquad (1)$$

where $a_{ij}$ and $b_i$ are non-negative constants depending on the circuit connectivity, as discussed in D. Hill et al., supra. It has been determined that transistor sizing is a posynomial programming problem, i.e. finding the optimal set of transistor sizes involves meeting a set of upper bound delay constraints on the posynomials representing path delay as functions of the transistor sizes, while simultaneously minimizing the sum of transistor sizes, which is also a posynomial function of transistor sizes. Every posynomial program is also a convex program. Thus the transistor sizing problem has the desirable property that a local optimum must necessarily be a global optimum. In particular, it is not possible that an optimization program will become trapped in a local optimum that is not the global optimum, since such local optima do not exist.

In particular, the TILOS program meets the delay requirements while minimizing the sum of transistor sizes to obtain locally optimal values in the revised netlist which are also globally optimal values.

The use of TILOS provides for computer run time for the transistor sizing step which is proportional to the size of the circuit. This is an advantage over previous transistor sizing methods which use mathematical programming methods with quadratic, cubic or higher run times.

In the disclosed method, the transistor sizing step outputs the netlist as clusters of transistors called basic cells having associated cell layouts. Typically a basic cell includes the transistors implementing a single logic gate, such as a NAND or NOR gate. For example, a basic cell may consist of the four transistors that make up a single complementary metal oxide semiconductor (CMOS) 2-input NAND gate. Since transistor sizes are specified for each cell, there may be several other cells also implementing CMOS 2-input NAND gates, each with its own unique set of transistor sizes. These basic cells may optionally be clustered using the clustering tool 36 into a set of supercells. Each supercell includes a tightly connected set of basic cells and associated interconnecting paths. In the exemplary embodiment, the clustering in step 50 is performed using the APART program, available from AT&T Corp., as the clustering tool 36 to group logical elements together in order to reduce the total number of cells and the routing complexity. The clustering in step 50 includes the steps of generating an estimate of the final cell library (which may be based upon user inputs); prompting the user to choose either the maximum, median, or a user-specified cell size (i.e. an estimated width of the cell in microns) to be used for logic clustering; receiving the chosen cell size from the input device 14; and performing the clustering with the chosen cell size as the maximum cluster size. For example, for a chosen cluster size of 50, the cluster tool 36 combines 3 cells of size 15, 20, and 10 into one new cluster, while a cell of size 35 would not be combined with a cell of size 20.

Figure 7:
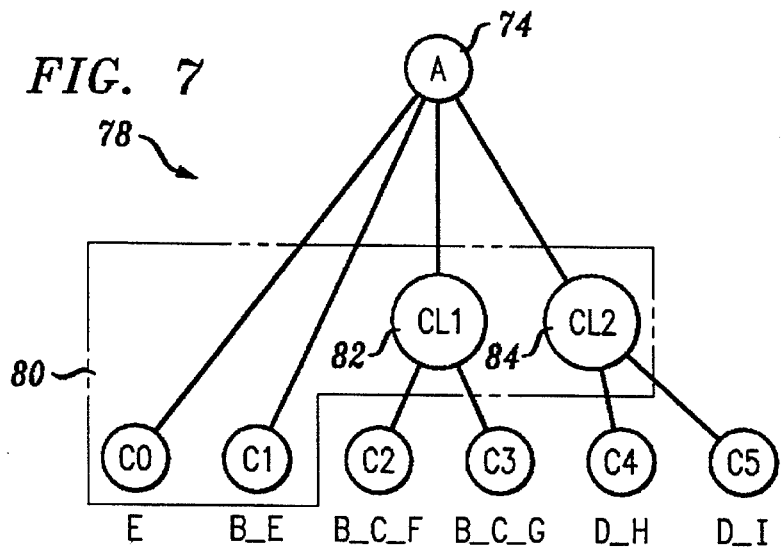
FIG. 7 illustrates clustering performed on a netlist.

The step 50 of clustering includes the step of performing logic clustering in which cells logically belonging together are combined to form supercells, thus reducing the number of cells and I/O connections which must be placed and routed while keeping the cells small enough to be handled by the cell library generating tool 30 and the place-and-route tool 32. Thus, logically strongly connected components are laid out together which reduces inefficiencies created during the placing and routing in step 54. For example, for a revised netlist output from the transistor sizing tool 26, the clustering tool 36 generates a clustered hierarchy 78 having an associated cell library 80 including supercells 82, 84 labelled CL1, CL2, respectively. Each supercell 82, 84 in cell library 80 is laid out as a single unit, as shown in the representation in FIG. 7, provided that the supercells 82, 84 do not exceed a predetermined total width set by default or by the user, where the width of the supercell is the sum of the widths of each component cell.

The output from the clustering in step 50 is a netlist specifying connections among supercells, as well as an internal netlist for each supercell. The internal supercell netlist specifies the connections among transistors in a supercell. The revised transistor netlist has a level of hierarchy above the cell level which specifies the supercell groupings along with a new list of library cells.

The cell library has the characteristics such that:

1) cells in the cell library satisfy the requirements and/or constraints of the place-and-route tool 30 in step 54; for example, the placement and height requirements; and
2) each generated cell implements the portion of the netlist connecting the transistors in the cell.

Additionally, it is typically advantageous to generate a cell library with minimum area. The system 10 may also have to apply a characterization process to each cell to determine the performance characteristics of the cell.

A variety of techniques are known for generating cell libraries as in step 52. In an exemplary embodiment, the cell library is generated by the Generator of Adaptive Cells (GENAC) program and the MACS program, available from AT&T Corp., where the GENAC program is discussed in C. Ong et al. "GENAC: An Automatic Cell Synthesis Tool", 26th ACM/IEEE DESIGN AUTOMATION CONF., Paper 16.2, 1989, pp. 239–243, and the MACS program is discussed in W. H. Crocker et al., "MACS: A Module Assembly and Compaction System", INT'L CONF. ON COMPUTER DESIGN, 1987, pp. 205–208. For each cell, GENAC generates virtual-grid layout implementing the transistor netlist. GENAC determines relative transistor placement, signal-wire routing, and transistor folding to create a virtual-grid layout that, after compaction, is as compact as possible. The virtual grid layout is then compacted by a compactor program such as MACS, which is a layout compactor that produces, for each cell, a complete description of mask features and actual dimensions for input to the place-and-route tool 30.

In generating the cell library, certain methodologies may contribute to a reduced area; for example, by using diffusion layers for routing paths. The disclosed mask layout generating system 10 and method operates using such diffusion layers as well as contacts for routing paths in the IC. In an exemplary embodiment, the generation of the cell library by the place-and-route tool 30 is controlled by the intended technology and cell style of the IC to be fabricated, the library cell height, the power rail width, and whether the source and drain regions of the transistors are to be half-strapped or fully strapped with metal-to-diffusion contacts. In addition, for cells with I/O connections along a line through the middle of the cell may require the height of the I/O line to be specified.

In order to increase layout density and to meet cell height restrictions imposed by the place-and-route tool 30, it may be necessary to fold large transistors. A transistor may be folded by breaking it into several smaller pieces, by laying the pieces side-by-side, and by then connecting the pieces in parallel.

Figure 8:
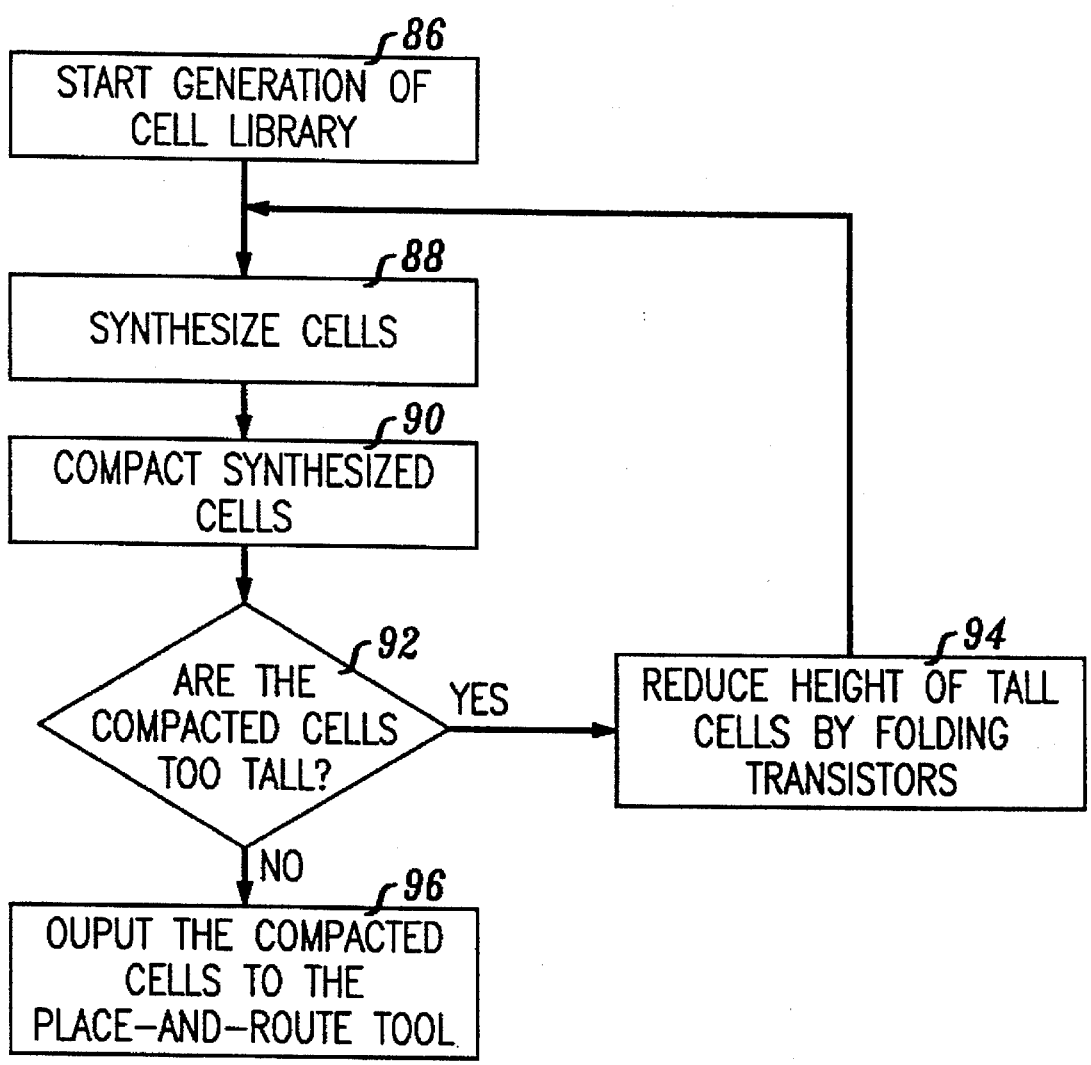
FIG. 8 is a flowchart illustrating a method of generation of a cell library.

The cell library generating tool 28 iteratively generates a netlist of cells according to the method shown in FIG. 8, which includes the step of starting cell library generation in step 86, synthesizing cells using GENAC in step 88, compacting the cells in step 90, and determining if the compacted cells are too tall compared to a predetermined cell height specification in step 92. If the compacted cells are too tall, the method shown in FIG. 7 reduces the folding height in step 94, and loops back to repeat steps 88–94 to repeat the synthesis and compacting until the resultant compacted cells are within the predetermined cell height specification as determined in step 92. The resultant compacted cells are then output in step 96 to the placing and routing tool 30.

As shown in FIG. 2, the disclosed mask layout generating method further includes the steps of performing placing and routing in step 54 by inputting the revised netlist and the cell library to the place-and-route tool 30. In an exemplary embodiment, the place-and-route tool 30 is the LTX3 program and/or the LTX2 program available from AT&T Corp., which are discussed in A. E. Dunlop et al. "A Procedure for Placement of Standard-Cell VLSI Circuits", IEEE TRANS. ON COMPUTER-AIDED DESIGN, VOL. CAD-4, NO. 1, January 1985, pp. 92–98. In step 54, the place-and-route tool 30 arranges and connects the cells in the cell library to generate a mask layout that implements the desired circuit in a manner similar to a standard cell design.

The disclosed method then extracts performance characteristics and logic of the mask layout in step 56 using an extraction tool 32, such as, for example, the GOALIE2 program, available from AT&T Corp. and discussed in T. G. Szymanski et al., "Space Efficient Algorithms for VLSI Artwork Analysis", 20TH DESIGN AUTOMATION CONF., 1983, Paper 46.3, pp. 734–739. The method also includes the step of verifying the mask layout in step 58 from the extracted performance characteristics and logic using the layout verification tool 34, such as, for example, the GEMINI3 program, available from AT&T Corp. and discussed in C. Ebeling et al., "Validating VLSI Circuit Layout by Wirelist Comparison", INT'L CONF. ON COMPUTER-AIDED DESIGN, 1983, pp. 172–173.

The disclosed method then determines whether the extracted performance characteristics, including timing characteristics such as path delays, are satisfactory in step 60; i.e. meeting the timing specification of the input data 12. If the performance characteristics are not satisfactory, the method revises the netlist and list of cells in step 62 and loops back to perform steps 48–62 to revise the mask layout using the revised netlist and list of cells.

In addition, step 60 may evaluate the timing characteristics using known timing analysis techniques with a more conservative timing model than the timing model used by the transistor sizing tool in step 48. The method in step 62 may then include the step of revising the timing specification to be more conservative to meet the timing evaluation in both of steps 48 and 62 of FIG. 2.

Steps 48–60 are repeated until the performance characteristics determined in step 60 are satisfactory. The method then generates final mask layout data corresponding to a final mask layout in step 64, and outputs the final mask layout data to output device 42 in step 66 to output the mask layout 40.

The outputting of the final mask layout data to generate the final mask layout 40 in step 66 may be performed by the output graphics tool 38, such as the GRED program available from AT&T Corp., or any output graphics tool which controls the output device 42 including a display to display the mask layout graphically.

Alternatively, the mask layout generating system 10 may be operatively connected to an IC fabricator (not shown in FIG. 1). The mask layout generating system 10 outputs the generated mask layout 40 from the output device 42 to the IC fabricator, which then fabricates integrated circuits using the generated mask layout 42 by mask generating procedures known in the art, such as discussed, for example, in VLSI TECHNOLOGY (S. M. Sze, Ed.), McGraw-Hill Inc., New York, 1988.

While the disclosed system and method for generating mask layouts has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention. For example, equivalent embodiments in hardware and/or software may be adapted to implement the disclosed mask and layout system and method.

What is claimed is:

1. An apparatus for generating a mask layout from input data, including a timing specification, the apparatus comprising:

memory and stored programs, including a plurality of mask layout tools having a cell library generation tool for generating a cell library of cell layouts from a cell netlist, a place-and-route tool for using the cell library to generate mask layout data, and a clustering tool for clustering the cell netlist; and a processor operated by an automatic mask layout generation program for sequentially applying the plurality of mask layout tools, including an automatic transistor sizing tool, for sizing transistors to generate the cell netlist from the input data, and for generating, based on the input data and the cell netlist, the mask layout data corresponding to the mask layout, wherein the clustering tool clusters the cell netlist generated by the transistor sizing tool into a plurality of supercells for use by the cell library generation tool to generate the cell library.

2. The apparatus of claim 1 wherein the transistor sizing tool reorders series-connected networks specified by the input data to generate the cell netlist.

3. The apparatus of claim 1 wherein the cell library generation tool includes:

a synthesizer tool for generating a virtual grid layout for each cell layout of the cell netlist; and a compactor tool for compacting the plurality of virtual grid cells to generate the cell library of cell layouts.

4. The apparatus of claim 3 wherein the cell library generation tool repeatedly applies the synthesizer tool and the compactor tool until each of the compacted cells has a cell height within a predetermined cell height specification.

5. The apparatus of claim 1 wherein the plurality of mask layout tools includes:

a performance verification tool for verifying that the generated mask layout attains a predetermined criteria.

6. The apparatus of claim 5 wherein the plurality of mask layout tools includes:

an extraction tool for extracting performance characteristics of the generated mask layout; and wherein the processor is adapted to revise the cell netlist to generate at least one successive mask layout until the extraction tool and the verification tool, applied to the at least one successive mask layout, determine that a final mask layout of the at least one successive mask layout attains the predetermined criteria.

7. The apparatus of claim 1 wherein the plurality of mask layout tools includes:

a performance verification tool for verifying that the generated mask layout attains a predetermined criteria.

8. An automatic mask layout generating system for automatically generating a mask layout for fabricating an integrated circuit therefrom, the automatic mask layout generating system comprising:

an input device for receiving input data, including a timing specification and a transistor netlist corresponding to the integrated circuit;

a processing unit including:

associated memory and stored programs, including a plurality of mask layout tools, including a cell library generation tool for generating a cell library of cell layouts from a cell netlist, a place-and-route tool for using the cell library to generate mask layout data, and a clustering tool for clustering the cell netlist; and a processor operated by an automatic mask layout generation program for iteratively applying the plurality of mask layout tools to process the timing specification and the transistor netlist of the input data by transistor sizing using the transistor sizing tool to generate a revised netlist, to generate the cell library of cells from the revised netlist using the cell library generation tool, to perform placing and routing of the cell library using the place-and-route tool, and to revise the revised netlist to generate a final netlist and the mask layout data corresponding to a final mask layout, wherein the clustering tool clusters the cell netlist generated by the transistor sizing tool into a plurality of supercells for use by the cell library generation tool to generate the cell library; and an output device for outputting the mask layout data to generate the final mask layout.

9. The automatic mask layout generating system of claim 8 wherein the processor applies a Timed Logic Synthesizer (TILOS) program, a transistor sizing tool meeting delay requirements of the integrated circuit and minimizing the sum of transistor sizes for generating a revised netlist having locally optimal transistor size values as globally optimal transistor size values.

10. The automatic mask layout generating system of claim 8 wherein the processor applies a Generator of Adaptive Cells (GENAC) program, a virtual-grid based symbolic cell generator for generating, for each cell, a relative placement of transistors and interconnecting wires within the respective cell, and for determining a folding of transistors within cells to generate the cell library of cells having minimal area and matching cell heights.

11. The automatic mask layout generating system of claim 8 wherein the processor applies the LTX3 program, a place-and-route tool which arranges and connects cells in the cell library to perform placing and routing of the cells for generating the mask layout data corresponding to the mask layout of the integrated circuit.

12. A method for generating a mask layout of an integrated circuit specified by a netlist and a timing specification, the method comprising the steps of:

a) automatically sizing the transistors specified in the netlist to revise the netlist;

b) clustering the sized transistors into supercells;

c) generating a cell library of cells from the revised netlist, the supercells, and the timing specification; and d) placing and routing the cells to generate the mask layout of the integrated circuit.

13. The method of claim 12 wherein the step of generating the cell library includes the steps of:

b1) synthesizing a virtual grid layout for each cell from the netlist; and b2) compacting each cell using the virtual grid layout to generate the cell library of cells.

14. The method of claim 12 wherein:

the step of automatically sizing the transistors includes using a Timed Logic Synthesizer (TILOS) program, a transistor sizing tool meeting delay requirements of the integrated circuit and minimizing the sum of transistor sizes for generating a revised netlist having locally optimal transistor size values as globally optimal transistor size values.

15. A method for generating a mask layout of an integrated circuit specified by a netlist and a timing specification, the method comprising the steps of:
   a) automatically sizing the transistors specified in the netlist to revise the netlist;
   b) generating a cell library of cells from the revised netlist and the timing specification;
   c) placing and routing the cells to generate the mask layout of the integrated circuit;
   d) extracting performance characteristics from the mask layout;
   e) verifying the mask layout; and
   f) repeating steps (a)–(e) to revise the netlist until the extracted performance characteristics of the mask layout generated from the revised netlist attains a predetermined criteria.

16. A method for generating a mask layout of an integrated circuit specified by a netlist and a timing specification, the method comprising the steps of:
   a) automatically sizing the transistors specified in the netlist to revise the netlist;
   b) generating a cell library of cells from the revised netlist and the timing specification, including the steps of;
      b1) synthesizing a virtual grid layout for each cell from the netlist;
      b2) compacting each cell using the virtual grid layout to generate the cell library of cells;
      b3) determining whether each of the compacted cells has an associated cell height within a predetermined cell height specification;
      b4) reducing cell heights of cells that exceed the predetermined cell height specification by folding transistors with those cells; and
      b5) repeating steps (b1)–(b4) until each of the compacted cells has an associated cell height within the predetermined cell height specification; and
   c) placing and routing the cells to generate the mask layout of the integrated circuit.

17. A mask layout of an integrated circuit specified by a netlist and a timing specification, the mask layout generated by a method comprising the steps of:
   a) automatically sizing the transistors specified in the netlist to revise the netlist;
   b) clustering the sized transistors into supercells;
   c) generating a cell library of cells from the supercells, the revised netlist and the timing specification; and
   d) placing and routing the cells to generate the mask layout of the integrated circuit.

18. An integrated circuit specified by a netlist and a timing specification, the integrated circuit fabricated using a mask layout generated by a method comprising the steps of:
   a) automatically sizing the transistors specified in the netlist to revise the netlist;
   b) clustering the sized transistors into supercells;
   c) generating a cell library of cells from the supercells, the revised netlist and the timing specification; and
   d) placing and routing the cells to generate the mask layout of the integrated circuit.

19. An apparatus for generating a mask layout from input data, including a timing specification, the apparatus comprising:
   a plurality of mask layout tools, including an automatic transistor sizing tool and a clustering tool; and
   a processor operated by an automatic mask layout generation program for sequentially applying the plurality of mask layout tools, including the automatic transistor sizing tool, for sizing transistors to generate a cell netlist from the input data, wherein the cell netlist includes cells having at most about 30 transistors, having interconnections associated therewith, and having cell specifications, the processor for applying the clustering tool to cluster the cell netlist generated by the transistor sizing tool into a plurality of supercells specified by a cell library, and for generating, based on the input data, the cell library, and the cell netlist, mask layout data corresponding to the mask layout.

20. A mask layout of an integrated circuit specified by a transistor netlist and a timing specification, the mask layout generated by a method comprising the steps of:
   a) automatically sizing the transistors specified in the transistor netlist to revise the transistor netlist to generate a cell netlist;
   b) clustering the cell netlist generated by the transistor sizing tool into a plurality of supercells;
   c) generating a cell library of cells from the cell netlist and the timing specification; and
   d) placing and routing the cells to generate the mask layout of the integrated circuit.

21. An integrated circuit specified by a transistor netlist and a timing specification, the integrated circuit fabricated using a mask layout generated by a method comprising the steps of:
   a) automatically sizing the transistors specified in the transistor netlist to revise the transistor netlist to generate a cell netlist;
   b) clustering the cell netlist generated by the transistor sizing tool into a plurality of supercells;
   c) generating a cell library of cells from the cell netlist and the timing specification; and
   d) placing and routing the cells to generate the mask layout of the integrated circuit.

* * * * *